(12) United States Patent
Chow et al.

(10) Patent No.: US 8,524,553 B2
(45) Date of Patent: Sep. 3, 2013

(54) INTEGRATED CIRCUIT MODIFICATION USING WELL IMPLANTS

(75) Inventors: Lap-Wai Chow, South Pasadena, CA (US); William M. Clark, Jr., Camarillo, CA (US); James P Baukus, Westlake Village, CA (US); Gavin J. Harbison, Marina del Rey, CA (US)

(73) Assignee: HRL Laboratories, LLC, Malibu, CA (US)

( * ) Notice: Subject to any disclaimer, the term of this patent is extended or adjusted under 35 U.S.C. 154(b) by 613 days.

(21) Appl. No.: 12/399,628

(22) Filed: Mar. 6, 2009

(65) Prior Publication Data
US 2009/0170255 A1 Jul. 2, 2009

Related U.S. Application Data

(62) Division of application No. 10/735,841, filed on Dec. 12, 2003, now Pat. No. 7,514,755.

(51) Int. Cl.
*H01L 21/4763* (2006.01)

(52) U.S. Cl.
USPC .......................... 438/199; 438/527

(58) Field of Classification Search
USPC .................................. 438/199, 527
See application file for complete search history.

(56) References Cited

U.S. PATENT DOCUMENTS

| | | | |
|---|---|---|---|
| 3,673,471 A | 6/1972 | Klein et al. | |
| 3,898,105 A | 8/1975 | Mai | 438/276 |
| 3,946,426 A | 3/1976 | Sanders | |
| 3,983,620 A | 10/1976 | Spadea | |
| 4,017,888 A | 4/1977 | Christie et al. | |
| 4,101,344 A | 7/1978 | Kooi et al. | |
| 4,139,864 A | 2/1979 | Schulman | |
| 4,143,854 A | 3/1979 | Vetter | 254/93 |
| 4,145,701 A | 3/1979 | Kawagoe | |
| 4,164,461 A | 8/1979 | Schilling | |
| 4,196,443 A | 4/1980 | Dingwall | |
| 4,267,578 A | 5/1981 | Vetter | |
| 4,291,391 A | 9/1981 | Chatterjee et al. | |
| 4,295,897 A | 10/1981 | Tubbs et al. | |
| 4,314,268 A | 2/1982 | Yoshioka et al. | |
| 4,317,273 A | 3/1982 | Guterman et al. | |
| 4,322,736 A | 3/1982 | Sasaki et al. | |
| 4,374,454 A | 2/1983 | Jochems | |

(Continued)

FOREIGN PATENT DOCUMENTS

| EP | 0 186 855 | 7/1986 |
|---|---|---|
| EP | 0 364 769 | 4/1990 |

(Continued)

OTHER PUBLICATIONS

Response to British Office Action for British Patent Application No. 0512203.1 (Mar. 6, 2007).

(Continued)

*Primary Examiner* — Eugene Lee
(74) *Attorney, Agent, or Firm* — Ladas & Parry

(57) ABSTRACT

A technique for and structures for camouflaging an integrated circuit structure. The integrated circuit structure is formed having a well of a first conductivity type under the gate region being disposed adjacent to active regions of a first conductivity type. The well forming an electrical path between the active regions regardless of any reasonable voltage applied to the integrated circuit structure.

13 Claims, 9 Drawing Sheets

(56) References Cited

U.S. PATENT DOCUMENTS

| | | | |
|---|---|---|---|
| 4,393,575 A | 7/1983 | Dunkley | 438/186 |
| 4,409,434 A | 10/1983 | Basset et al. | |
| 4,435,895 A | 3/1984 | Parrillo | |
| 4,471,376 A | 9/1984 | Morcom et al. | |
| 4,493,740 A | 1/1985 | Komeda | |
| 4,530,150 A | 7/1985 | Shirato | |
| 4,581,628 A | 4/1986 | Miyauchi et al. | |
| 4,583,011 A | 4/1986 | Pechar | |
| 4,603,381 A | 7/1986 | Guttag et al. | |
| 4,623,255 A | 11/1986 | Suszko | |
| 4,636,822 A | 1/1987 | Codella et al. | |
| 4,727,038 A | 2/1988 | Watabe | 438/304 |
| 4,729,001 A | 3/1988 | Haskel | |
| 4,753,897 A | 6/1988 | Lund et al. | |
| 4,766,516 A | 8/1988 | Ozdemir | 361/380 |
| 4,771,012 A | 9/1988 | Yabu et al. | |
| 4,799,096 A | 1/1989 | Koeppe | |
| 4,814,854 A | 3/1989 | Tigelaar et al. | 257/382 |
| 4,821,085 A | 4/1989 | Haken et al. | |
| 4,829,356 A | 5/1989 | Arndt | |
| 4,830,974 A | 5/1989 | Chang et al. | |
| 4,860,084 A | 8/1989 | Shibata | |
| 4,912,053 A | 3/1990 | Schrantz | |
| 4,927,777 A | 5/1990 | Hsu et al. | 438/305 |
| 4,931,411 A | 6/1990 | Tigelaar et al. | 438/201 |
| 4,939,567 A | 7/1990 | Kenney | |
| 4,962,484 A | 10/1990 | Takeshima et al. | |
| 4,975,756 A | 12/1990 | Haken et al. | |
| 4,998,151 A | 3/1991 | Korman et al. | |
| 5,015,596 A | 5/1991 | Toyoda et al. | |
| 5,016,077 A | 5/1991 | Sato | 257/408 |
| 5,030,796 A | 7/1991 | Swanson et al. | |
| 5,050,123 A | 9/1991 | Castro | |
| 5,061,978 A | 10/1991 | Mizutani et al. | |
| 5,065,208 A | 11/1991 | Shah et al. | |
| 5,068,697 A | 11/1991 | Noda et al. | |
| 5,070,378 A | 12/1991 | Yamagata | |
| 5,073,812 A | 12/1991 | Shimura | |
| 5,101,121 A | 3/1992 | Sourgen | |
| 5,117,276 A | 5/1992 | Thomas et al. | |
| 5,120,669 A | 6/1992 | Schrantz | |
| 5,121,089 A | 6/1992 | Larson et al. | |
| 5,121,186 A | 6/1992 | Wong et al. | |
| 5,132,571 A | 7/1992 | McCollum et al. | |
| 5,138,197 A | 8/1992 | Kuwana | |
| 5,146,117 A | 9/1992 | Larson et al. | |
| 5,168,340 A | 12/1992 | Nishimura | |
| 5,177,589 A | 1/1993 | Kobayashi et al. | |
| 5,202,591 A | 4/1993 | Walden | |
| 5,210,437 A | 5/1993 | Sawada et al. | |
| 5,225,699 A | 7/1993 | Nakamura | |
| 5,227,649 A | 7/1993 | Chapman | |
| 5,231,299 A | 7/1993 | Ning et al. | |
| 5,302,539 A | 4/1994 | Haken et al. | |
| 5,308,682 A | 5/1994 | Morikawa | |
| 5,309,015 A | 5/1994 | Kuwata et al. | |
| 5,317,197 A | 5/1994 | Roberts | |
| 5,336,624 A | 8/1994 | Walden | |
| 5,341,013 A | 8/1994 | Koyanagi et al. | |
| 5,345,105 A | 9/1994 | Sun et al. | |
| 5,354,704 A | 10/1994 | Yang et al. | |
| 5,369,299 A | 11/1994 | Byrne et al. | |
| 5,371,390 A | 12/1994 | Mohsen | |
| 5,371,443 A | 12/1994 | Sun et al. | 315/247 |
| 5,376,577 A | 12/1994 | Roberts et al. | |
| 5,378,641 A | 1/1995 | Cheffings | 438/286 |
| 5,384,472 A | 1/1995 | Yin | |
| 5,384,475 A | 1/1995 | Yahata | |
| 5,399,441 A | 3/1995 | Bearinger et al. | |
| 5,404,040 A | 4/1995 | Hsieh et al. | |
| 5,412,237 A | 5/1995 | Komori et al. | |
| 5,441,902 A | 8/1995 | Hsieh et al. | |
| 5,453,635 A | 9/1995 | Hsu | 257/336 |
| 5,468,990 A | 11/1995 | Daum | |
| 5,475,251 A | 12/1995 | Kuo et al. | |
| 5,506,806 A | 4/1996 | Fukushima | |
| 5,510,279 A | 4/1996 | Chien et al. | 438/302 |
| 5,531,018 A | 7/1996 | Saia et al. | |
| 5,539,224 A | 7/1996 | Ema | |
| 5,541,614 A | 7/1996 | Lam et al. | |
| 5,571,735 A | 11/1996 | Mogami et al. | |
| 5,576,988 A | 11/1996 | Kuo et al. | |
| 5,580,804 A | 12/1996 | Joh | 438/231 |
| 5,585,658 A | 12/1996 | Mukai et al. | 257/344 |
| 5,611,940 A | 3/1997 | Zettler | |
| 5,635,749 A | 6/1997 | Hong | 257/402 |
| 5,638,946 A | 6/1997 | Zavracky | |
| 5,650,340 A | 7/1997 | Burr et al. | 438/286 |
| 5,675,172 A | 10/1997 | Miyamoto et al. | 257/402 |
| 5,677,557 A | 10/1997 | Wuu et al. | |
| 5,679,595 A | 10/1997 | Chen et al. | |
| 5,702,972 A | 12/1997 | Tsai | 438/305 |
| 5,719,422 A | 2/1998 | Burr et al. | |
| 5,719,430 A | 2/1998 | Goto | |
| 5,721,150 A | 2/1998 | Pasch | |
| 5,744,372 A | 4/1998 | Bulucea | 438/231 |
| 5,763,916 A | 6/1998 | Gonzalez et al. | 257/345 |
| 5,783,375 A | 7/1998 | Twist | |
| 5,783,846 A | 7/1998 | Baukus et al. | |
| 5,789,298 A | 8/1998 | Gardner et al. | 438/286 |
| 5,811,340 A | 9/1998 | Park | |
| 5,821,147 A | 10/1998 | Kizilyali | |
| 5,821,590 A | 10/1998 | Lee et al. | |
| 5,831,306 A | 11/1998 | Gardner et al. | 257/344 |
| 5,834,356 A | 11/1998 | Bothra et al. | |
| 5,834,809 A | 11/1998 | Kato et al. | 257/335 |
| 5,838,047 A | 11/1998 | Yamauchi et al. | |
| 5,854,510 A | 12/1998 | Sur et al. | |
| 5,858,843 A | 1/1999 | Doyle et al. | |
| 5,866,933 A | 2/1999 | Baukus et al. | |
| 5,874,328 A | 2/1999 | Liu et al. | 439/199 |
| 5,877,050 A | 3/1999 | Gardner et al. | 438/231 |
| 5,880,503 A | 3/1999 | Matsumoto et al. | |
| 5,888,887 A | 3/1999 | Li et al. | |
| 5,891,782 A | 4/1999 | Hsu et al. | 438/302 |
| 5,895,241 A | 4/1999 | Lu et al. | |
| 5,909,622 A | 6/1999 | Kadosh et al. | 438/286 |
| 5,920,097 A | 7/1999 | Horne | |
| 5,925,914 A | 7/1999 | Jiang | 257/344 |
| 5,930,663 A | 7/1999 | Baukus et al. | |
| 5,930,667 A | 7/1999 | Oda | |
| 5,933,737 A | 8/1999 | Goto | |
| 5,960,291 A | 9/1999 | Krivokapic | 438/286 |
| 5,973,375 A * | 10/1999 | Baukus et al. | 257/399 |
| 5,977,593 A | 11/1999 | Hara | |
| 5,998,257 A | 12/1999 | Lane et al. | |
| 5,998,272 A | 12/1999 | Ishida et al. | 438/305 |
| 6,010,929 A | 1/2000 | Chapman | |
| 6,020,227 A | 2/2000 | Bulucea | 438/194 |
| 6,030,869 A | 2/2000 | Odake et al. | 438/266 |
| 6,031,272 A | 2/2000 | Hiroki et al. | 257/404 |
| 6,037,627 A | 3/2000 | Kitamura et al. | |
| 6,044,011 A | 3/2000 | Marr | 365/154 |
| 6,046,659 A | 4/2000 | Loo et al. | |
| 6,054,659 A | 4/2000 | Lee et al. | |
| 6,057,520 A | 5/2000 | Goodwin-Johansson | |
| 6,064,110 A | 5/2000 | Baukus et al. | |
| 6,078,080 A | 6/2000 | Kadosh et al. | 257/344 |
| 6,080,614 A | 6/2000 | Neilson et al. | |
| 6,084,248 A | 7/2000 | Inoue | 257/66 |
| 6,090,692 A | 7/2000 | Song | 438/592 |
| 6,093,609 A | 7/2000 | Chuang | |
| 6,103,563 A | 8/2000 | Lukanc et al. | 438/231 |
| 6,117,762 A * | 9/2000 | Baukus et al. | 438/618 |
| 6,137,318 A | 10/2000 | Takaaki | |
| 6,146,952 A | 11/2000 | Nariman et al. | 438/286 |
| 6,153,484 A | 11/2000 | Donaton et al. | |
| 6,154,388 A | 11/2000 | Oh | |
| 6,215,158 B1 | 4/2001 | Choi | |
| 6,242,329 B1 | 6/2001 | Huster et al. | 438/531 |
| 6,255,174 B1 | 7/2001 | Yu | 438/286 |
| 6,261,912 B1 | 7/2001 | Hsiao et al. | |
| 6,294,816 B1 | 9/2001 | Baukus et al. | |
| 6,316,303 B1 | 11/2001 | Lin et al. | 438/222 |

| | | |
|---|---|---|
| 6,326,675 B1 | 12/2001 | Scott et al. |
| 6,337,249 B1 | 1/2002 | Yamane et al. ............... 438/279 |
| 6,365,453 B1 | 4/2002 | Deboer et al. |
| 6,373,106 B2 | 4/2002 | Maki et al. |
| 6,380,041 B1 | 4/2002 | Yeap et al. ...................... 438/302 |
| 6,384,457 B2 | 5/2002 | Tyagi et al. ................... 257/408 |
| 6,399,452 B1 | 6/2002 | Krishnan et al. .............. 438/305 |
| 6,410,413 B2 | 6/2002 | Scott et al. |
| 6,455,388 B1 | 9/2002 | Lai et al. ........................ 438/303 |
| 6,465,315 B1 | 10/2002 | Yu .................................. 438/306 |
| 6,466,489 B1 | 10/2002 | Ieong et al. ............. 365/189.09 |
| 6,476,449 B1 | 11/2002 | Lin ................................ 257/360 |
| 6,479,350 B1 | 11/2002 | Ling .............................. 438/265 |
| 6,503,787 B1 | 1/2003 | Choi |
| 6,534,787 B1 | 3/2003 | Hsu ................................ 257/66 |
| 6,566,204 B1 | 5/2003 | Wang et al. |
| 6,613,661 B1 | 9/2003 | Baukus ........................... 438/598 |
| 6,653,694 B1 | 11/2003 | Osanai .......................... 257/392 |
| 6,740,942 B2 | 5/2004 | Baukus et al. |
| 6,746,924 B1 | 6/2004 | Lee et al. ....................... 438/286 |
| 6,815,816 B1 | 11/2004 | Clark et al. |
| 6,825,530 B1 | 11/2004 | Brown et al. |
| 6,833,307 B1 | 12/2004 | Wristers et al. ............... 438/302 |
| 6,833,589 B2 | 12/2004 | Matsuhashi et al. .......... 257/350 |
| 6,911,694 B2 | 6/2005 | Negoro et al. ................ 257/336 |
| 6,921,690 B2 | 7/2005 | Church .......................... 438/241 |
| 6,930,361 B2 | 8/2005 | Inaba ............................ 257/408 |
| 6,933,250 B2 | 8/2005 | Totsuka et al. |
| 6,933,560 B2 | 8/2005 | Lee ................................ 257/328 |
| 7,012,273 B2 | 3/2006 | Chen ................................. 257/4 |
| 7,091,114 B2 | 8/2006 | Ito ................................. 438/527 |
| 7,179,712 B2 | 2/2007 | Hoefler .......................... 438/278 |
| 7,208,383 B1 | 4/2007 | Weintraub et al. ............ 438/302 |
| 7,242,063 B1 | 7/2007 | Chow et al. ................... 257/369 |
| 7,344,932 B2 | 3/2008 | Chow ............................ 438/298 |
| 2001/0042892 A1 | 11/2001 | Okada ........................... 257/382 |
| 2002/0043689 A1 | 4/2002 | Matsuoka et al. ............ 257/368 |
| 2002/0058368 A1 | 5/2002 | Tseng |
| 2002/0096776 A1 | 7/2002 | Chow ............................ 257/774 |
| 2002/0173131 A1 | 11/2002 | Clark, Jr. et al. |
| 2002/0190355 A1 | 12/2002 | Baukus et al. |
| 2003/0057476 A1 | 3/2003 | Morita et al. |
| 2003/0127709 A1 | 7/2003 | Lippmann ..................... 257/758 |
| 2003/0173622 A1 | 9/2003 | Porter et al. |
| 2003/0205816 A1* | 11/2003 | Janke ............................ 257/758 |
| 2004/0051137 A1 | 3/2004 | Kitamura ...................... 257/344 |
| 2004/0061186 A1 | 4/2004 | Chow et al. |
| 2004/0075147 A1 | 4/2004 | Ueda et al. .................... 257/368 |
| 2004/0099912 A1 | 5/2004 | Chow et al. |
| 2004/0144998 A1 | 7/2004 | Chow ............................ 257/213 |
| 2004/0164361 A1 | 8/2004 | Baukus .......................... 257/402 |
| 2004/0211990 A1 | 10/2004 | Asano ........................... 257/279 |
| 2005/0082625 A1 | 4/2005 | Kim ............................... 257/412 |
| 2005/0230787 A1 | 10/2005 | Chow ............................ 257/629 |
| 2006/0049449 A1 | 3/2006 | Iino ................................ 257/315 |
| 2006/0071278 A1 | 4/2006 | Takao ............................ 257/365 |
| 2006/0105489 A1 | 5/2006 | Rhodes ........................... 438/48 |
| 2006/0157803 A1 | 7/2006 | Chow ............................ 257/399 |

FOREIGN PATENT DOCUMENTS

| | | |
|---|---|---|
| EP | 0 463 373 | 1/1992 |
| EP | 0 528 302 | 2/1993 |
| EP | 0 585 601 | 3/1994 |
| EP | 0 764 985 | 3/1997 |
| EP | 0 883 184 | 12/1998 |
| EP | 0 920 057 | 6/1999 |
| EP | 1 193 758 | 4/2002 |
| EP | 1 202 353 | 5/2002 |
| FR | 2 486 717 | 1/1982 |
| JP | S58-016565 | 7/1982 |
| JP | 58-190064 | 1/1983 |
| JP | S59-035465 | 2/1984 |
| JP | 61-147551 | 7/1986 |
| JP | 61-201472 | 9/1986 |
| JP | 63-129647 | 6/1988 |
| JP | H01-213350 | 8/1989 |
| JP | 02-046762 | 2/1990 |
| JP | H02-062118 | 3/1990 |
| JP | 02-188944 | 7/1990 |
| JP | 02-237038 | 9/1990 |
| JP | H02-237038 | 9/1990 |
| JP | 04-028092 | 1/1992 |
| JP | H04-267553 | 9/1992 |
| JP | 05-218849 | 8/1993 |
| JP | H05-218849 | 8/1993 |
| JP | H08-274041 | 10/1996 |
| JP | 10-256398 | 9/1998 |
| JP | 2000-040809 | 2/2000 |
| JP | 2000-040810 | 2/2000 |
| WO | 98/21734 | 5/1998 |
| WO | 98/57373 | 12/1998 |
| WO | 00/44012 | 7/2000 |
| WO | 0055889 | 9/2000 |

OTHER PUBLICATIONS

British Office action for British Patent Application No. 0512203.1 (Nov. 10, 2006).

Response to British Office Action for British Patent Application No. 0512203.1 (Oct. 9, 2006).

British Office action for British Patent Application No. 0512203.1 (Jun. 7, 2006).

Response to British Office Action for British Patent Application No. 0512203.1 (Apr. 26, 2006).

Blythe, et al., "Layout Reconstruction of Complex Silicon Chips," *IEEE Journal of Solid-State Circuits*, vol. 28, No. 2, pp. 138-145 (Feb. 1993).

Frederiksen, Thomas M., "Standard Circuits in the New CMOS Era," *Intuitive CMOS Electronics*, Revised Edition, pp. 134-146 (Jan. 1989).

Hodges and Jackson, *Analysis and Design of Digital Integrated Circuits*, 2nd edition, McGraw-Hill, p. 353 (1988).

IBM_TDB "Double Polysilicon Dynamic Memory Cell with Polysilicon Bit Line," vol. 21, Issue No. 9, pp. 3828-3831 (Feb. 1979).

IBM_TDB, "Static Ram Double Polysilicon Process," vol. 23, Issue No. 8 pp. 3683-3686 (Jan. 1981).

Larson, L.E., et al., "Microactuators for GaAs-based Microwave Integrated Circuits," *IEEE*, pp. 743-746 (1991).

Lee, "Engineering a Device for Electron-Beam Probing," *IEEE Design and Test of Computers*, pp. 36-49 (Jun. 1989).

Ng. K.K., *Complete Guide to Semiconductor Devices*, McGraw-Hill, Inc., pp. 164-165 (1995).

Sze, S.M., *VLSI Technology*, McGraw-Hill, pp. 99, 447, 461-465 (1983).

Sze, S.M., ed., "Silicides for Gates and Interconnections," *VLSI Technology*, McGraw-Hill, pp. 372-380 (1983).

U.S. Appl. No. 09/758,792, filed Jan. 11, 2001, Baukus.

U.S. Appl. No. 09/391,258, filed Sep. 7, 1999, Baukus.

VLSI manufacturing process, pp. 172 and 279, published 1997 in Taiwan (untranslated).

Office action dated May 28, 2002 from Taiwanese Patent No. 201664 with its English translation.

Office action mailed on Feb. 8, 2011 for Japanese Patent Application No. 2000-614502 and its English translation.

* cited by examiner

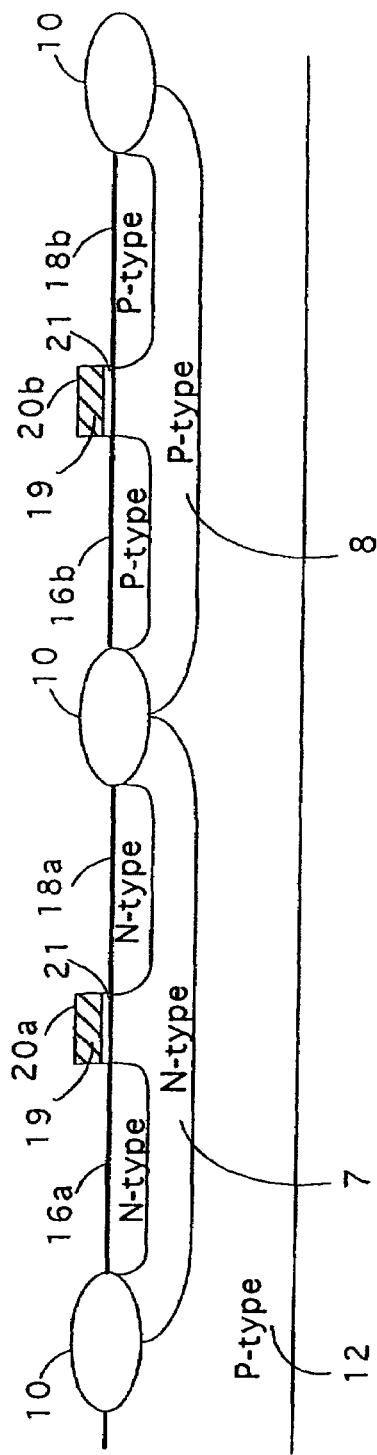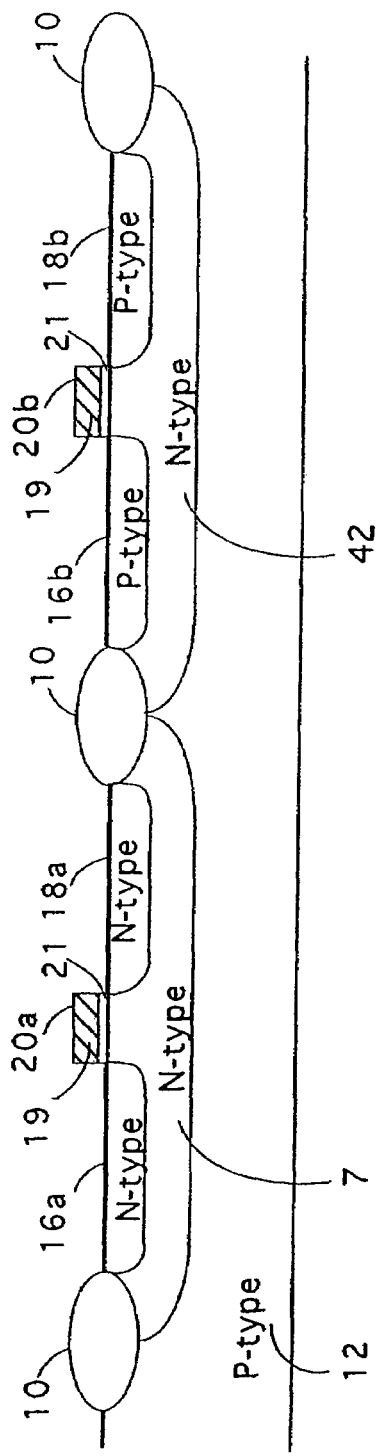

INTEGRATED CIRCUIT MODIFICATION USING WELL IMPLANTS

CROSS-REFERENCE TO RELATED APPLICATION

This application is a division of U.S. application Ser. No. 10/735,841, filed on Dec. 12, 2003 which is now U.S. Pat. No. 7,514,755 with an Issue Date of Apr. 7, 2009.

This application claims the benefits of U.S. Provisional Patent Application No. 60/433,314 filed Dec. 13, 2002, the disclosure of which is hereby incorporated herein by reference.

This application is also related to U.S. patent application Ser. No. 09/758,792 and to U.S. patent application Ser. No. 09/882,892 filed Jun. 15, 2001 mentioned below.

TECHNICAL FIELD

The present invention relates to integrated circuits and semiconductor devices (ICs) in general and their methods of manufacture wherein the integrated circuits and semiconductor devices employ camouflaging techniques, which would make it difficult for the reverse engineer to discern how the semiconductor device is manufactured.

RELATED ART

The present invention is related to the following US patents and patent applications by some of the same inventors as the present inventors:

(1) U.S. Pat. Nos. 5,866,933 and 6,294,816 teach how transistors in a CMOS circuit are connected by implanted (and therefore hidden and buried) lines between the transistors by modifying the p+ and n+ source/drain masks. These implanted interconnections are used to make 3-input AND or OR circuits look substantially identical to the reverse engineer. Also, buried interconnects force the reverse engineer to examine the IC in greater depth to try to figure out the connectivity between transistors and hence their function.

(2) U.S. Pat. Nos. 5,783,846; 5,930,663 and 6,064,110 teach a further modification in the source/drain implant masks so that the implanted connecting lines between transistors have a gap inserted, with approximately the length of the minimum feature size of the CMOS technology being used. If this gap is "filled" with one kind of implant, the line conducts; but if it is "filled" with another kind of implant, the line does not conduct. The intentional gaps are called "channel blocks." The reverse engineer is forced to determine connectivity based on resolving the implant type at the minimum feature size of the CMOS process being used.

(3) U.S. Pat. No. 6,117,762 teaches method and apparatus for protecting semiconductor integrated circuits from reverse engineering. Semiconductor active areas are formed on a substrate and a silicide layer is formed both over at least one active area of the semiconductor active areas and over a selected substrate area for interconnecting the at least one active area with another area through the silicide area formed on the selected substrate area.

(4) U.S. Pat. No. 4,583,011 discloses a method and circuit arrangement for foiling an attempt to copy a MOS integrated circuit by implementing in the circuit an additional pseudo MOS device, which from its location in the circuit would appear to a would-be copier to be an enhancement mode device. However, the pseudo MOS device is implemented with a depletion implant.

(5) U.S. Pat. No. 5,973,375 discloses connections between implanted regions of adjacent transistors in a semiconductor substrate are made by buried conductive implants under field oxide layers. Buried conductive implants also referred to as buried contacts have doping concentrations similar to the doping concentrations of source/drain implants. Typical buried contacts have a doping concentration on the order of $10^{18}$ atoms/CM$^3$.

(6) U.S. patent application Ser. No. 09/758,792 discloses a double poly process technique that allows transistors to be ON or OFF depending upon implant details.

(7) U.S. patent application Ser. No. 09/882,892, filed on Jun. 15, 2001 and a related PCT application PCT/US02/19075 filed on Jun. 13, 2002, discloses a buried contact implant used under the gate region. The buried contact structure used in the patent application has approximately the same doping concentrations and depth of source/drain implants.

BACKGROUND OF THE INVENTION

The creation of complex integrated circuits and semiconductor devices can be a very expensive undertaking given the large number of hours of sophisticated engineering talent involved in designing such devices. Additionally, integrated circuits can include read-only memories into which software, in the form of firmware, is encoded. Further, integrated circuits are often used in applications involving the encryption of information, and therefore in order to keep such information confidential, it can be desirable to keep such devices from being reverse engineered. Thus, there can be a variety of reasons for protecting integrated circuits and other semiconductor devices from being reversed engineered.

In order to keep the reverse engineer at bay, different techniques are known in the art to make integrated circuits more difficult to reverse engineer. One technique that is used is to make the connections between transistors difficult enough to determine that the reverse engineer must carefully analyze each transistor (in particular, each CMOS transistor pair for CMOS devices), and not use automatic circuit and pattern recognition techniques in order to reverse engineer the integrated circuit. Since integrated circuits can have hundreds of thousands or even millions of transistors, forcing the reverse engineer to carefully analyze each transistor in a device can effectively frustrate the reverse engineer's ability to reverse engineer the device successfully.

The prior art techniques mentioned above, if successful, will force the reverse engineer to study the metal connections to try to figure out the boundaries of standard circuits and to try to figure out their function. For example, gate connections may utilize the polysilicon layer (the first polysilicon layer in a process having two or more polysilicon layers) and the reverse engineer would look for these contacts, knowing that these gate contacts are typically the input to transistors and hence to a standard circuit. In addition, the source and drain contacts are made to the substrate via metal interconnects. One way in which the reverse engineer might work would be to look for cell boundaries by means of looking for silicon-to-gate poly metal lines, as these suggest the possibilities for contacts between the output (the drain contact) from one transistor cell into the input (the gate contact) of a next transistor cell. If this can be done, the reverse engineer can define cell boundaries by these silicon-gate poly lines. Then, by noting the cell boundaries, the reverse engineer can find the cell characteristics (for example, size and number of transistors) and from this make reasonable assumptions as to the cell's function. In addition to cell boundaries, the reverse engineer may also rely upon the size of the transistor and its location. For example, P-channel devices (PMOS) are larger than N-channel devices (NMOS), and all PMOS devices are grouped in one row while all NMOS devices are grouped in a different row. This information could then be stored in a database for automatic classification of other similar cells.

It is an object of this invention to make reverse engineering more difficult and, in particular, to force the reverse engineer to study implants under the gates. It is believed that this will make the reverse engineer's efforts all the more difficult by making it very time consuming, and perhaps making it exceedingly impractical, if not impossible, to reverse engineer a chip employing the present invention. The present invention can be used harmoniously with techniques disclosed in the prior United States patents and patent applications identified above to further confuse the reverse engineer.

FIG. 1a depicts a simplified cross-section of a prior art single well CMOS device. In a NMOS device, shown on the left, an active region 16a is typically a n-type source region, while active region 18a is typically a n-type drain region disposed in a p-type substrate 12. A gate 20a may be manufactured out of a layer of polysilicon 19 disposed upon a layer of gate oxide 21. The gate 20a is disposed between the two active regions 16a, 18a. Field Oxide 10 isolates the NMOS device from the PMOS device of the CMOS pair and other semiconductor devices within the IC. In a PMOS device, shown on the right, an active region 16b is typically a p-type source region, while active region 18b is typically a p-type drain region disposed in a n-type well 42 of the substrate 12. A gate 20b may be manufactured out of a layer of polysilicon 19 disposed upon a layer of gate oxide 21. The gate 20b is disposed between the two p-type active regions 16b, 18b. The n-type well 42 isolates the p-type active regions 16b, 18b from the p-type substrate 12.

FIG. 1b depicts a simplified cross-section of another prior art CMOS device. Two major goals in the semiconductor industry are to increase the density and to increase the speed of digital or analog integrated circuits (ICs). Increasing the density means using smaller channel lengths and widths. In order to satisfy the conditions such as separation of highly integrated fine or minute elements of a semiconductor device, some n-type devices of a CMOS pair having a substrate of a first conductivity type have a well of the same conductivity type as the substrate. FIG. 1b is a simplified cross-sectional view of such a prior art CMOS device, the NMOS device being shown on the left while the PMOS device is shown on the night. The NMOS device has a well 14 of a first conductivity type formed in the first conductivity type semiconductor substrate 12. In the example shown in FIG. 1b, the substrate 12 is a p-type semiconductor substrate and well 14 is a p-type well. The source region 16a and drain region 18a of the NMOS device have a second conductivity and are preferably of n-type. Field Oxide 10 isolates the NMOS device from the PMOS device in the CMOS pair and also isolates the semiconductor device from other semiconductor devices within the IC. The gates 20a, 20b are manufactured out of a layer of polysilicon 19 disposed on a layer of gate oxide 21. In the PMOS device, the source region 16b and drain region 18b are p-type. Under the source region 16b and drain region 18b is a n-type well 42.

The present invention preferably makes use of a standard CMOS manufacturing process called a "double well process" in which the semiconductor substrate of a first conductivity has a well having a first conductivity type, and a well having a second conductivity type. One skilled in the art will appreciate, after reading this patent, that the present invention may also make use of other CMOS processes that are not double well processes. Masks are used to determine the location and shapes of the first conductivity type wells and the second conductivity type wells.

As will be seen, changing the location of the different wells forms a conduction path between two active regions, such as the source and drain. Thus, the resulting semiconductor device will be permanently ON for any reasonable gate voltage. Therefore, with the present invention, the circuit may be constructed to look the same as some conventional circuits, but the functionality of selected transistors will be quite different and therefore the circuit will function quite differently from the circuit that it visually mimics. Since the reverse engineering process looks for repeating patterns of circuit devices (as seen from a top or plan view) and assumes that all repeating patterns reflect the same circuit functions, the reverse engineer is apt to assume an incorrect function when trying to copy the original integrated circuit. Thus, the real functionality of the integrated circuit in which the present invention is used is hidden. Of course, if this technique of making a pattern of transistors mimic a conventional circuit but perform a different function is used hundreds or thousands of times in a complex integrated circuit having perhaps millions of transistors, the reverse engineer ends up with not only a device which does not work, but also a daunting task of trying to figure out what went wrong with the assumptions that he or she made in analyzing the chip to be reverse engineered. This additional effort, if undertaken, forces the reverse engineer to spend additional time trying to determine how the chip in question is really configured.

The present invention not only provides a device and method that will confuse the reverse engineer, but it also provides a simpler path to implementation than other methods of inhibiting the reverse engineering process. The technique disclosed herein may be utilized to modify the library design of a particular vendor as opposed to forming a completely new and different appearing library. Thus, those skilled in the art will appreciate that the cost and time associated with the present invention is less than other methods used to inhibit integrated circuits from being reverse engineered.

Note that the present invention might only be used once in a thousand of instances of what appears to be a semiconductor device or a pattern of devices on the chip in question, but the reverse engineer will have to look very carefully at each semiconductor device or pattern knowing full well that for each semiconductor device or pattern that he or she sees, there is a very low likelihood that it has been modified by the present invention. The reverse engineer will be faced with having to find the proverbial needle in a haystack.

Briefly, and in general terms, the present invention comprises a method of camouflaging an integrated circuit for the purpose of deterring a reverse engineer, wherein a well of the same type as the source and drain regions is placed under the gate in contact with the source and drain region.

In another aspect, the present invention provides for camouflaging an integrated circuit structure. The integrated circuit structure is formed by a plurality of wells. The well under the gate being disposed adjacent to the same type source and drain regions.

DESCRIPTION OF THE DRAWINGS

FIG. 2 is a simplified cross-sectional view of a CMOS device depicting one embodiment of the present invention;

FIG. 3 is a simplified cross-sectional view of a CMOS device in which the n-type device has been modified in accordance with the present invention;

DETAILED DESCRIPTION

The present invention now will be described more fully hereinafter with reference to the accompanying drawings, in which the preferred embodiments of the invention are shown. This invention may be embodied in many different forms and should not be construed as limited to the embodiments set forth herein.

Figure 1A:
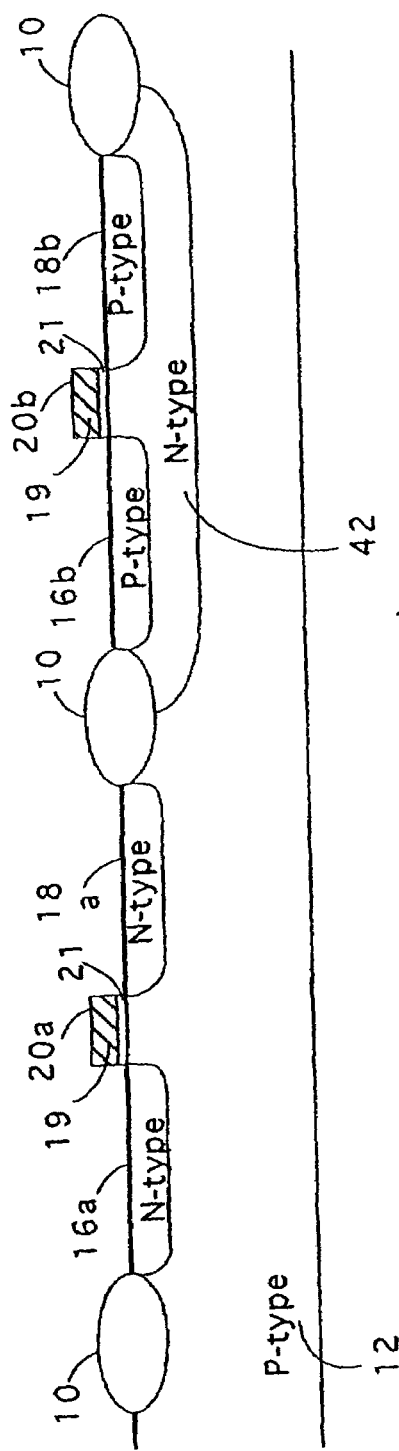
FIG. 1a is a simplified cross-sectional view of a prior art CMOS device with a single well process.
Figure 1B:
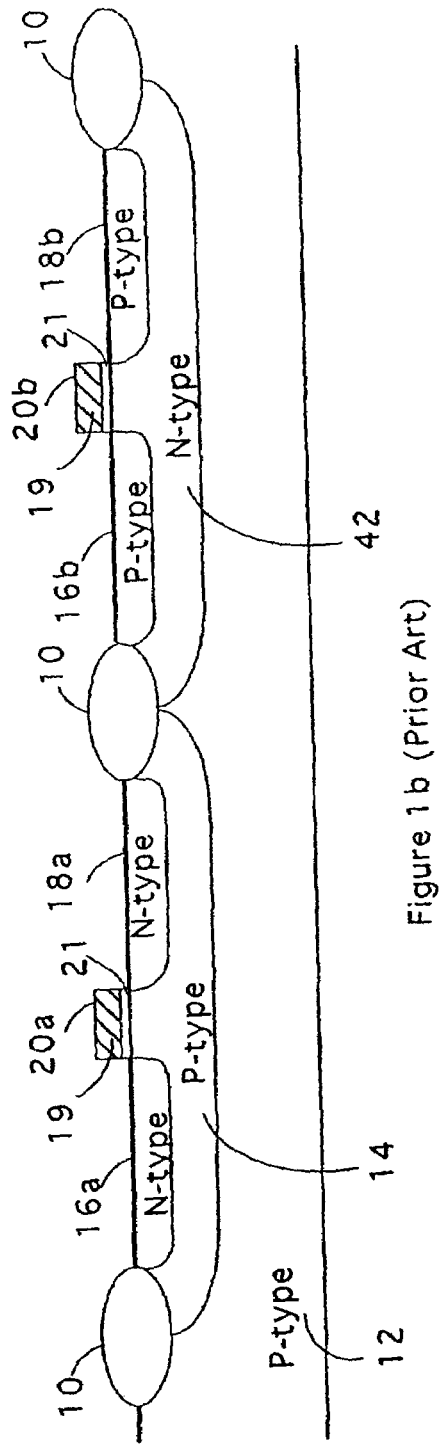
FIG. 1b is a simplified cross-sectional view of a prior art CMOS device having a substrate of a conductivity type and a well of the same conductivity type for the n-type device made by a double-well process.

FIG. 2 shows how the NMOS and PMOS devices within the CMOS of FIG. 1b can be intentionally turned ON by the present invention to give the appearance of a functioning transistor device to the reverse engineer when in fact the transistor is never turned OFF.

As shown in FIG. 2, p-type well 14 of FIG. 1b has been replaced by n-type well 7 and n-type well 42 of FIG. 1b has been replaced by p-type well 8. One skilled in the art will appreciate that changing the type of wells requires changing the openings in the masks during the formation of the p-type and n-type wells 7, 8. By changing the wells such that a n-type well 7 is between the n-type active regions 16a, 18a an electrical path is formed between active region 16a and active region 18a regardless of the voltages applied. The result is a transistor that is always ON, regardless of any reasonable voltage applied to the gate 20a. Further, by changing the wells such that a p-type well 8 is between the p-type active regions 16b, 18b an electrical path is formed between active region 16b and active region 18b regardless of the voltages applied. The result is a transistor that is always ON, regardless of any reasonable voltage applied to the gate 20b. A reasonable voltage refers to any gate voltage found in normal device operation such that the voltage does not break down the gate oxide 21.

FIG. 3 illustrates a simplified cross section of a CMOS device in accordance with another embodiment of the present invention. One skilled in the art will appreciate that the NMOS device of the CMOS pair of FIG. 1b may be modified without modifying the PMOS device of the CMOS pair. Thus, in FIG. 3, the p-type well 14 of FIG. 1b is replaced by the n-type well 7, while the PMOS device on the right remains unchanged from FIG. 1b to FIG. 3.

While the devices of FIGS. 2 and 3 provide devices that are always ON, the devices also pose leakage problems. If not all devices in a circuit are modified, then wells 7, 8 under the gate regions 20a, 20b which are the same conductivity type as the source and drain regions 16a, 18a, 16b, 18b may cause a current leakage if they are in close enough contact to each other. For example, in FIG. 3, it is possible that current from n-type well 7 could leak into n-type well 42 causing problems with the PMOS transistor of FIG. 3. Thus, if such leakage current is a problem, it is preferred that the wells 7, 8 be made smaller than the transistor to avoid this type of leakage. Thus the devices shown in FIGS. 4a-8 depict wells under the gates that are smaller than the associated transistors. While one skilled in the art will appreciate that this is not necessary, it does prevent the invention from causing other leakage problems within the circuit should that be of concern.

Figure 4A:
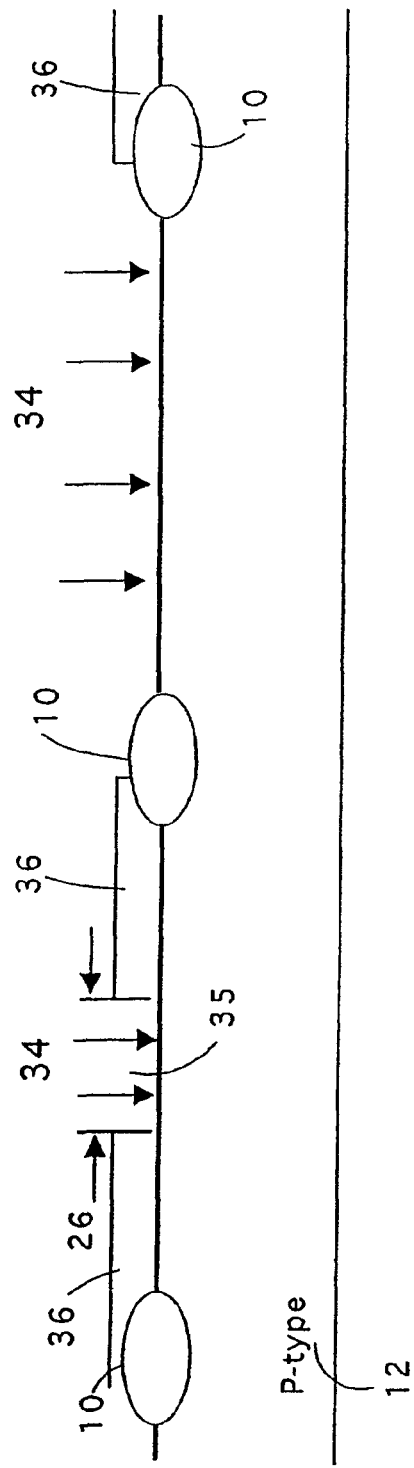
FIGS. 4a through 4c are exemplary simplified process sequences for a single well CMOS device in accordance with the present invention.
Figure 4B:
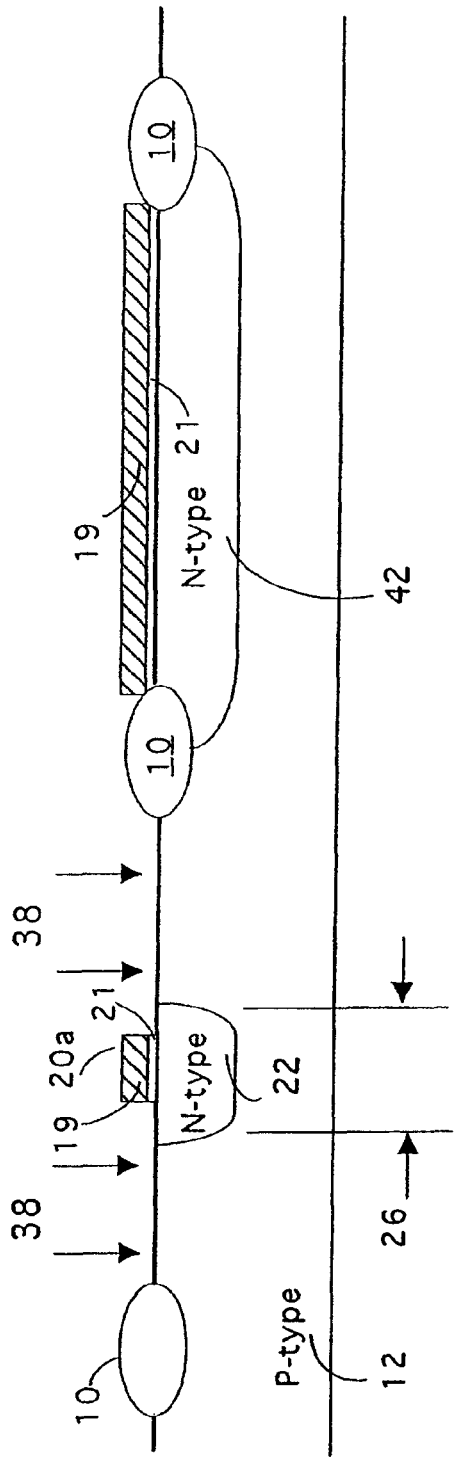
Figure 4C:
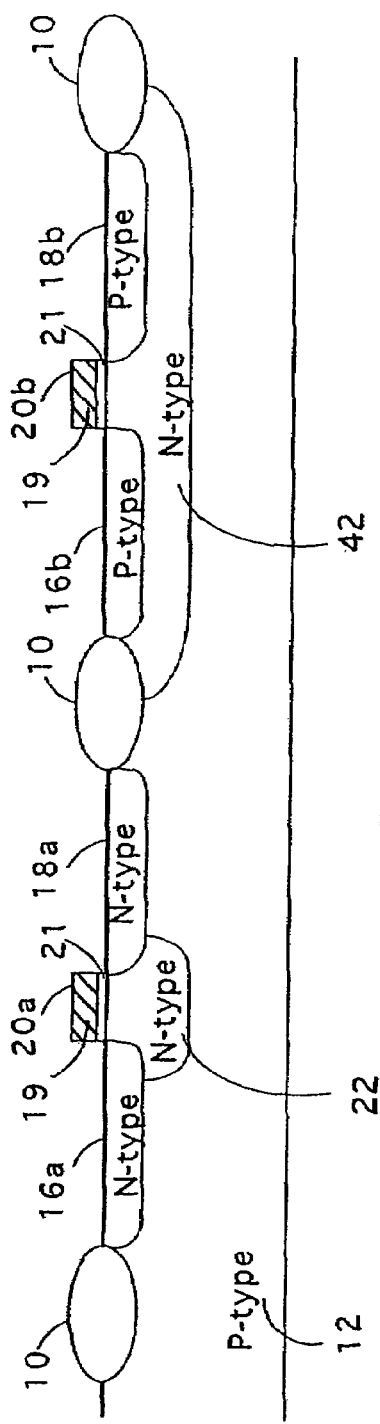

FIGS. 4a-4c show how the semiconductor device depicted in FIG. 1a can be intentionally turned ON by the present invention to give the appearance of a functioning transistor device to the reverse engineer when in fact the transistor is never turned OFF. The processing steps preferably utilized to arrive at the device shown in FIG. 4c will be discussed subsequently.

The CMOS transistor pair in FIG. 4c comprises a NMOS device, shown on the left and a PMOS device shown on the right. The NMOS transistor in FIG. 4c has a p-type substrate 12, two n-type active regions 16a, 18a and a gate 20a. The PMOS field-effect transistor in FIG. 4c has a p-type substrate 12, a n-type well 42, two p-type active regions 16b, 18b and gate 20b. The two n-type active regions 16a, 18a are typically referred to as source and drain regions. While this terminology may lose its meaning with respect to the present device, which is always ON, the use of the terms source and drain will be maintained for ease of understanding and comparison with conventional circuits. Beneath the gate 20a is an additional n-type well 22 connecting active regions 16a, 18a. The additional well 22 is the same conductivity type as the active regions 16a, 18a, thereby providing a conduction path between the active regions 16a, 18a regardless of the voltages applied. The result is a transistor that is always ON, regardless of any reasonable voltage applied to the gate 20a. A reasonable voltage refers to any gate voltage found in normal device operation such that the voltage does not break down the gate oxide 21. One skilled in the art will appreciate that the sizes of the features of the device shown in FIG. 4c, when viewed in a conventional plan view, would lead the reverse engineer to believe that this device is a normal NMOS device.

Prior art devices, such as those described in U.S. Pat. No. 5,973,375 and U.S. application Ser. No. 09/882,892 previously discussed, utilize buried contacts to connect active regions. One skilled in the art will appreciate that the doping concentration of a source or drain implant is typically on the order of $10^{19}$ atoms/cm$^3$. The doping concentration of a well is typically on the order of $10^{13}$ atoms/cm$^3$ to $10^{15}$ atoms/cm$^3$. The doping concentration of a buried contact is typically on the order of $10^{18}$ atoms cm$^3$. Thus, buried contacts refer to implants with a higher doping concentration than a well, typically much closer to the doping concentration of a source/drain implant. In the present device and method it is a well that is being used to provide the connection between the active regions. Further, the depth of a buried contact is generally more similar to the depth of the source/drain implants, while a well implant is generally deeper than the source/drain implants. Also, well 22 can be easily formed at the same time as well 42 is formed.

One skilled in the art will appreciate that there are a variety of different processes available for the manufacture of semiconductor devices. The following discussion is provided as an example relating to a 0.35 μm process in accordance with the present invention. The present invention may also be applied to other processes using the same basic methodology, although the exact details, such as dimensions and doping levels, will differ. Process steps used to make the devices shown in FIGS. 1a and 1b are well known in the art of manufacture of semiconductor devices; therefore, conventional processing steps are not discussed in any detail. Rather, the following simplified explanation is provided to elaborate on the process steps and process features preferably used to practice the present invention in terms of how the process steps differ from conventional process steps.

FIGS. 4a-4c depict processes that may be used in forming a device in accordance with the present invention. Turning to FIG. 4a, a resist mask 36 is formed on a substrate 12 of a NMOS device which is being formed of the left hand side of these figures. The substrate 12 is made of, for example, p-type silicon having a resistivity of, for example, 10 Ω/cm. In conventional processing, the resist mask 36 is etched and removed only over the PMOS transistors. In the present process, the resist mask is preferably etched to form an opening 35 over a portion of the NMOS device. The width 26 of the opening 35 is preferably greater than or equal to the minimum n-well width for the given process. For a 0.35 μm process, the minimum n-well width is typically 0.6 μm. Phosphorous ions 34 are preferably implanted into the substrate 12 so as to form a phosphorous implanted region, herein referred to as n-well 22 for the NMOS device being formed and n-well 42 (see FIG. 4b) for the PMOS device being formed on the right hand side of these figures. The phosphorous ions 34 may be implanted, for example, at an acceleration voltage of 180 keV and a dose of about $5.0 \cdot 10^{13}$ CM$^{-2}$. The implantation of the phosphorous ions results in a n-well 22 located beneath the gate 20a of FIG. 4b, and a n-well 42 located beneath the PMOS device. Typically, after the implantation of the phosphorus ions the substrate is preferably temperature cycled to drive in the ions to the desired depth in the substrate.

In FIG. 4b, the resist mask 36 has been removed and a gate oxide layer 21 and polysilicon layer 19 are formed over the surface of the substrate 12. For the NMOS device, a gate 20a is formed on the substrate 12 preferably by etching the gate oxide layer 21 and polysilicion layer 19. Phosphorous ions 38 may then be implanted, for example, into the substrate 12, to form n-regions 16a, 18a as shown in FIG. 4c. The phosphorous ions 38 may be implanted, for example, at an acceleration voltage of 20 keV and a dose of $5.0 \times 10^{15}$ CM$^{-2}$. One skilled in the art will appreciate that the concentration of phosphorous ions 38 is much larger when the n-regions 16a, 18a are formed compared to the concentration of phosphorous ions 34 when the n-wells 22, 42 are formed. One skilled in the art will appreciate that the combination of temperature and ion concentration can be varied in accordance with typical semiconductor process such that the desired depth of the various implants can be obtained. Preferably, the temperature cycles and the ion concentrations are chosen such that the n-type wells 22, 42 are deeper than the n-type source and drain regions 16a, 18a. The PMOS device shown in FIGS. 4a-4c is formed according to conventional process steps.

Figure 5A:
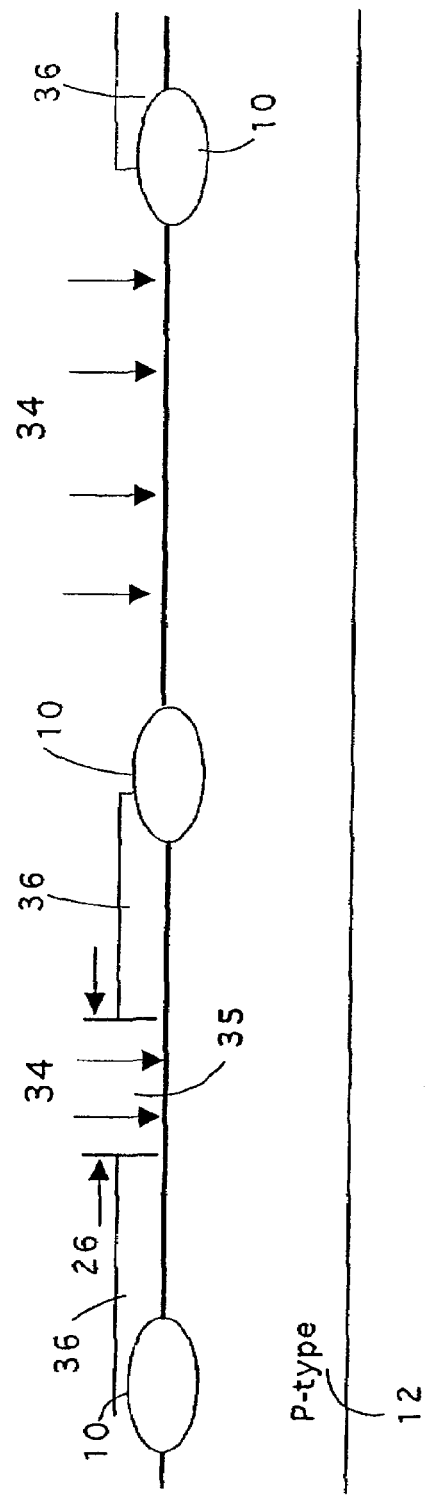
FIGS. 5a through 5d are exemplary simplified process sequences for a double well CMOS device in accordance with the present invention.

FIGS. 5a-5d depict an exemplary set of process steps that may be used in producing a double well CMOS device in accordance with the present invention. Turning to FIG. 5a, a resist mask 36 is formed on a p-type substrate 12 of a NMOS device which is being formed of the left hand side of these figures. In a standard double well semiconductor process, the resist mask 36 would cover the entire NMOS transistor region, and only the areas of the PMOS transistor region would be uncovered. The resist mask 36 is preferably etched over a portion of the NMOS device being fabricated for forming an opening 35 therein. The substrate 12 is made of, for example, p-type silicon having a resistivity of preferably 10 Ω/cm. Phosphorous ions 34 are implanted into the substrate 12 to form a phosphorous implanted region, herein referred to as n-wells 22, 42, shown in FIG. 5b. The phosphorous ions 34 may be implanted, for example, at an acceleration voltage of 180 keV and a dose of about $5 \cdot 10^{13}$ CM$^{-2}$. The implantation of the phosphorous ions results in an n-well 22 located beneath the gate 20a of the NMOS device, and in a n-well 42 located beneath the PMOS device. The width 26 of the opening 35 is preferably greater than or equal to the minimum n-well width for the given process. For a 0.35 μm process, the minimum n-well width is typically 0.6 μm. The substrate is preferably temperature cycled to drive in the ions to the desired depth.

Figure 5B:
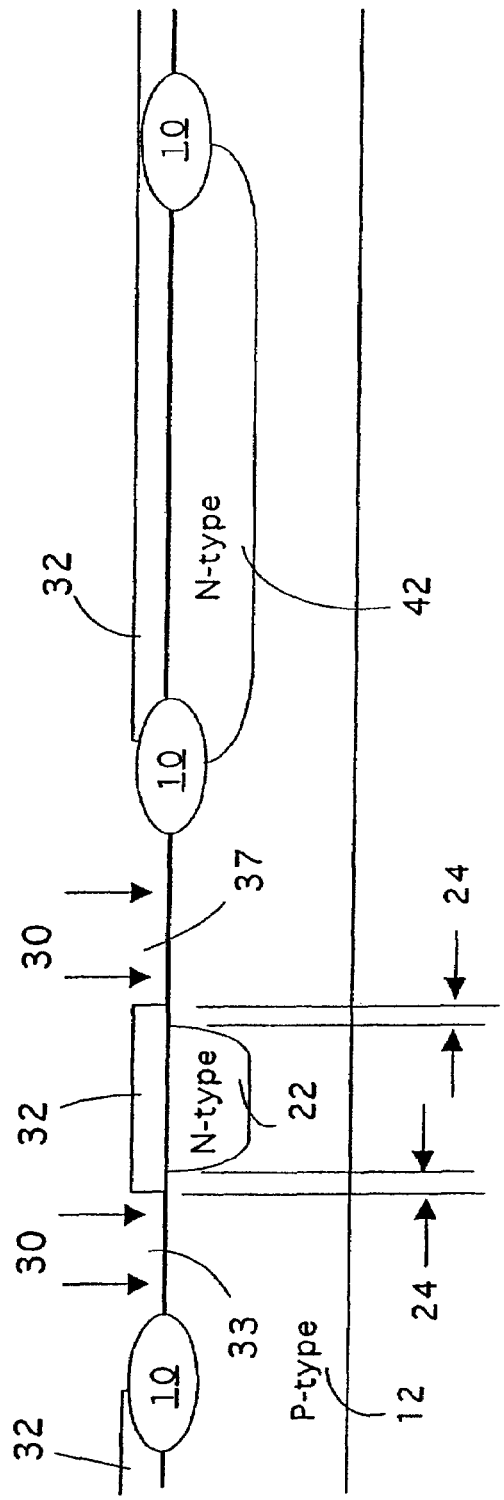

In FIG. 5b, the resist mask 36 has been removed and another resist mask 32 is formed on the substrate 12. In the present embodiment, the resist mask 32 is preferably etched to form two openings 33, 37, such that the portion of the resist mask 32 extends a distance 24 past the edge of the n-well 22. For the 0.35 μm process the distance 24 is typically equal to 0.16 μm, i.e. the minimum n-well to p-well separation. Boron ions 30 are implanted into the substrate 12 to form boron-implanted regions, herein referred to as p-wells 14a, 14b, shown in FIG. 5c. The boron ions 30 may be implanted, for example, at an acceleration voltage of 100 keV and a dose of about $3 \cdot 10^{13}$ CM$^{-2}$. In prior art processes, the resist mask 32 over n-well 22 would not be present, thus the prior art p-well 14 extends under the gate 20a as shown in FIG. 1b. The resist mask 32 over n-well 22 allows for control of the implantation of the region under the gate 20a. This boron region 14a, 14b is actually the p-well implant in a twin well process. As before, the substrate is typically temperature cycled to drive in the ions to the desired depth.

In FIG. 5b, the resist mask 36 has been removed and another resist mask 32 is formed on the substrate 12. In the present embodiment, the resist mask 32 is preferably etched to form two openings 33, 37, such that the portion of the resist mask 32 extends a distance 24 past the edge of the n-well 22. For the 0.35 μm process the distance 24 is typically equal to 0.16 μm, i.e. the minimum n-well to p-well separation. Boron ions 30 are implanted into the substrate 12 to form boron-implanted regions, herein referred to as p-wells 14a, 14b, shown in FIG. 5c. The boron ions 30 may be implanted, for example, at an acceleration voltage of 100 keV and a dose of about $3 \times 10^{13}$ CM$^{-2}$. In prior art processes, the resist mask 32 over n-well 22 would not be present, thus the prior art p-well 14 extends under the gate region 20a as shown in FIG. 1b. The resist mask 32 over n-well 22 allows for control of the implantation of the region under the gate 20a. This boron region 14a, 14b is actually the p-well implant in a twin well process. As before, the substrate is typically temperature cycled to drive in the ions to the desired depth.

Figure 5C:
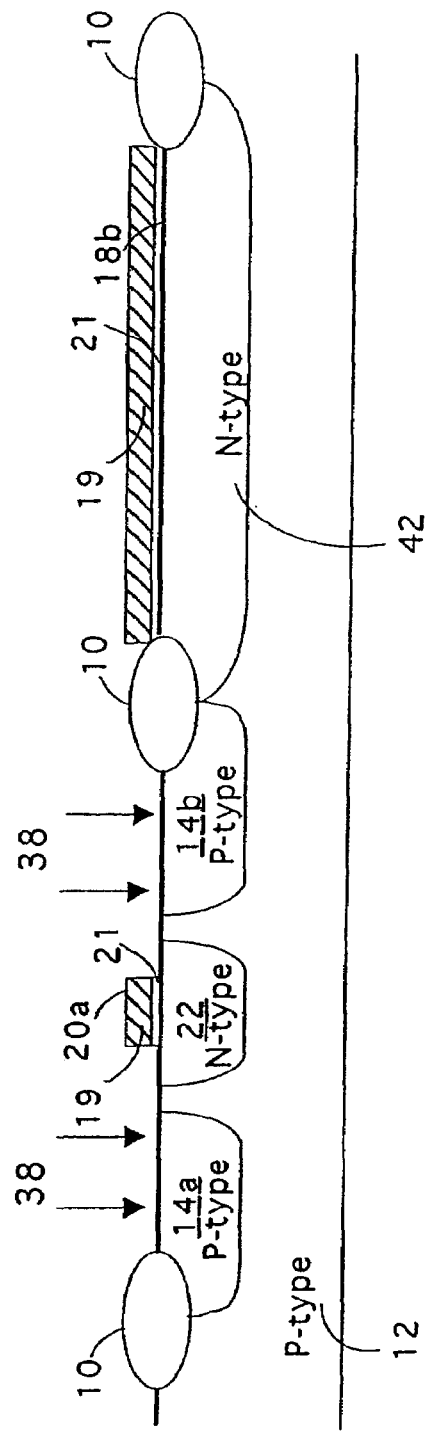
Figure 5D:
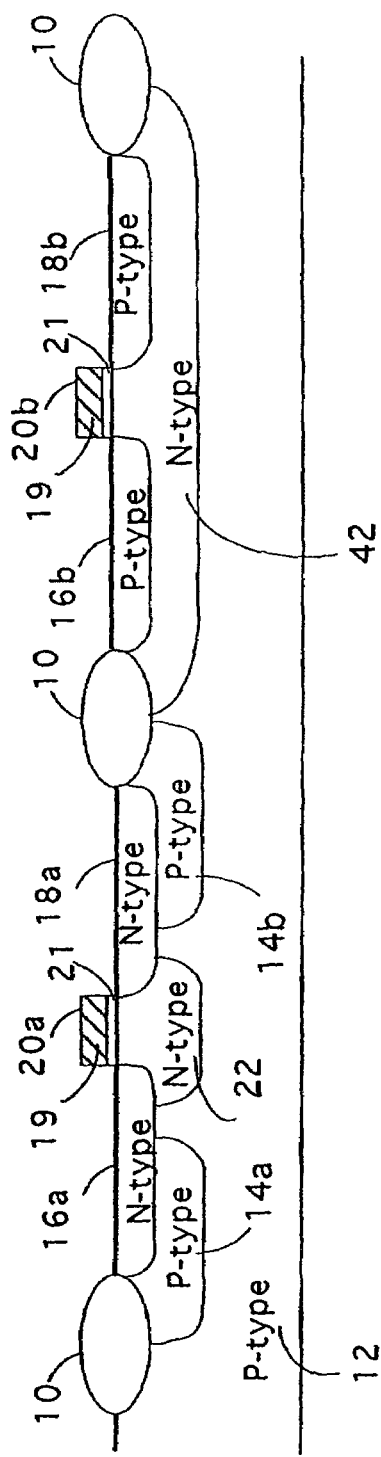

In FIG. 5c, the resist mask 32 has been removed and a gate oxide layer 21 and a polysilicon layer 19 is formed on the substrate 12. For the NMOS device, the gate oxide layer 21 and the polysilicon layer 19 are preferably etched to form the gate 20a. For the PMOS device, the gate oxide layer 21 and the polysilicon layer 19 form a resist mask over the PMOS device. Phosphorous ions 38 may be implanted, for example, into the substrate 12, to form n-type active regions 16a, 18a as shown in FIG. 5d. The phosphorous ions 38 may be implanted, for example, at an acceleration voltage of 70 keV and a dose of $5 \times 10^{15}$ cm$^{-2}$. One skilled in the art will appreciate that the concentration of phosphorous ions 38 is much larger when the active regions 16a, 18a are formed compared to the concentration of phosphorous ions 34 when the n-wells 22, 42 are formed. One skilled in the art will appreciate that the combination of temperature and ion concentration may be varied in accordance with typical semiconductor process such that the desired depth of each region can be obtained. Preferably, the temperature cycles and the ion concentrations are chosen such that the n-type wells 22, 42 are deeper than the n-type source and drain regions 16a, 18a. In addition, in some applications the temperature cycles and ion concentrations are preferably chosen such that the n-type wells 22, 42 are deeper than the p-type wells 14a, 14b.

Figure 6A:
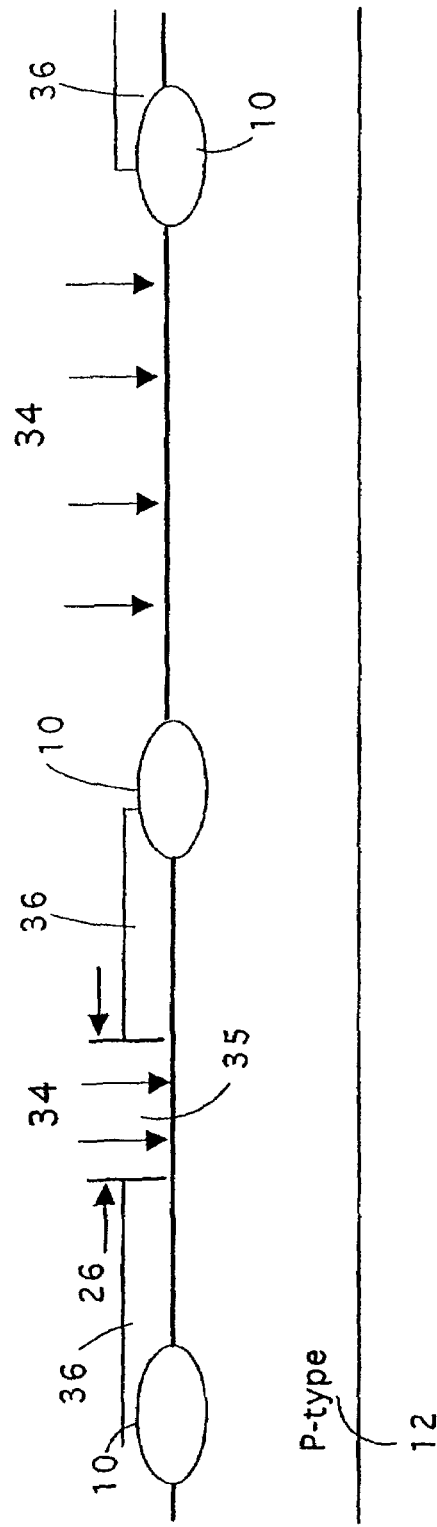
FIGS. 6a through 6d are a second set of exemplary simplified process sequences in accordance with the present invention.

There are other methods, other than the manufacturing process described above and shown in FIGS. 5a-5d, which may be used to provide the devices shown in FIG. 5d. A second method is shown in FIGS. 6a-6d. In FIG. 6a, the first step is the same as the step shown in FIG. 5a.

Figure 6B:
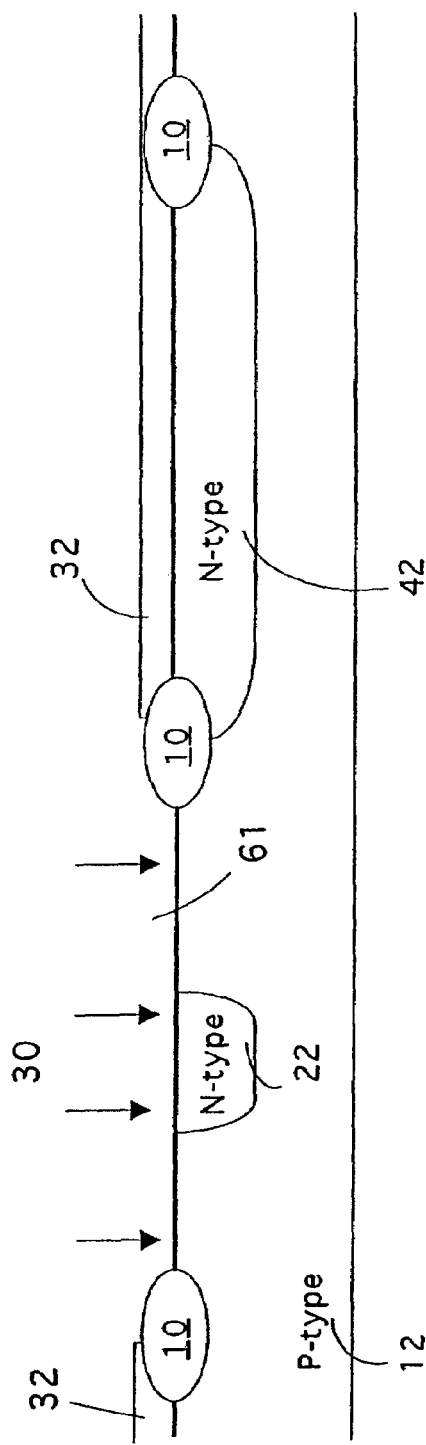

In FIG. 6b, however, the process step is different than the step shown in FIG. 5b. In FIG. 6b, the resist mask 32 is not placed over the n-type well 22 of the NMOS device. Boron ions 30 are implanted into the substrate 12 so as to form a boron implanted region, herein referred to as p-well 14, shown in FIG. 6c. The boron ions 30 may be implanted, for example, at an acceleration voltage of 100 keV and a dose of about $3 \times 10^{13}$ $CM^{-2}$. One skilled in the art will recognize that the p-well 14 is being implanted over the n-well 22, therefore the density of the phosphorous ions 34 forming the n-well 22 must be greater than the density of the boron ions 30 forming the p-well 14. Thus, the region under the gate 20a remains n-type due to the presence of n-well 22.

Figure 6C:
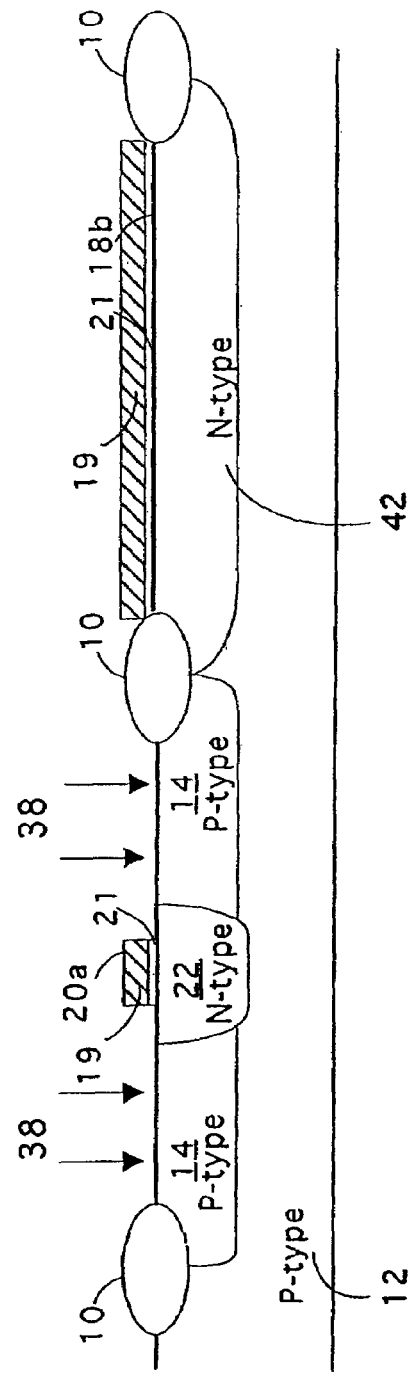
Figure 6D:
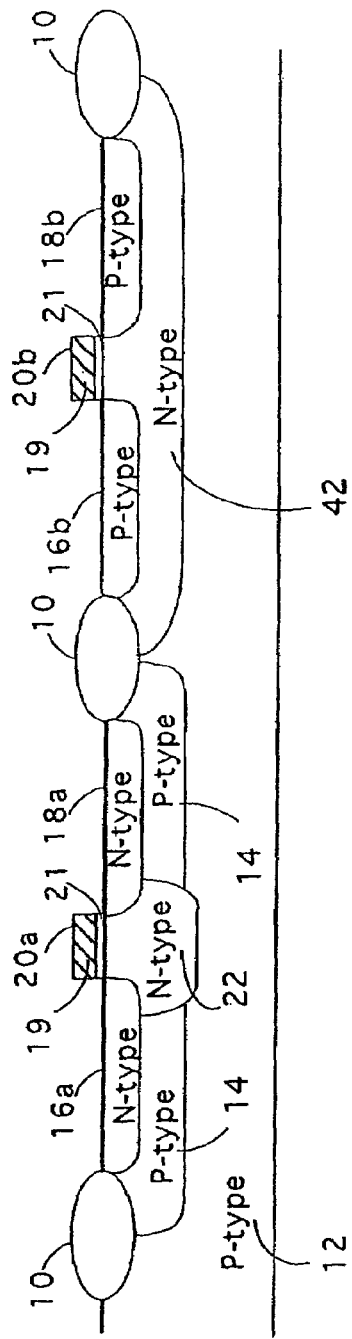

In FIG. 6c, the resist mask 32 has been removed and a gate oxide layer 21 and a polysilicon layer 19 are formed on the substrate 12. For the NMOS device, the gate oxide layer 21 and the polysilicon layer 19 are preferably etched to form the gate 20a. For the PMOS device, the gate oxide layer 21 and the polysilicon layer 19 form a resist mask over the PMOS device. Phosphorous ions 38 may be implanted, for example, into the substrate 12 to form n-type active regions 16a, 18a as shown in FIG. 6d. The phosphorous ions 38 may be implanted, for example, at an acceleration voltage of 20 keV and a dose of $5 \cdot 10^{15}$.

One skilled in the art will appreciate that the concentration of phosphorous ions 38 is much larger when the active regions 16a, 18a are formed compared to the concentration of phosphorous ions 34 when the n-wells 22, 42 are formed. One skilled in the art will appreciate that the combination of temperature and ion concentration can be varied in accordance with typical semiconductor process such that the desired region/well depth can be obtained. Preferably, the temperature cycles and the ion concentrations are chosen such that the n-type wells 22, 42 are deeper than the n-type source and drain regions 16a, 18a. In addition in some applications, the temperature cycles and ion concentrations are preferably chosen such that the n-type wells 22, 42 are deeper than the p-type well 14. This insures that n-type well 22 overrides p-type well 14.

One skilled in the art will appreciate that the p-type wells 14a, 14b are not required in order for the device to be always ON. However, given the small feature size of conventional devices, it is common for the devices to have a p-type well 14 of the same conductivity type as the substrate 12, as shown in FIG. 1b. In the preferred embodiment, the techniques described herein are used in standard double well CMOS manufacturing processes and as such, p-type wells 14a, 14b are used to avoid unnecessary modification of the semiconductor manufacturing process. In addition, the p-type wells 14a, 14b enable the NMOS device to withstand higher applied voltages. Further, the p-type wells 14a, 14b help to insulate that n-type active regions 6a, 18a from the substrate 12. However, one skilled in the art will appreciate that the semiconductor manufacturing process may be modified such that the p-type wells 14a, 14b are not provided in the device, as shown in FIGS. 4a-4c.

Another embodiment of the present invention utilizes a permanently ON PMOS transistor. Without adding additional processing steps to the formation of the semiconductor device, the PMOS device formed by the present invention can always be ON but shorted to the substrate. In the prior art PMOS transistors, such as the one shown in FIG. 1b, the n-well 42 is implanted first. Next, p-regions 16b, 18b are implanted to form the source and drain of the PMOS transistor.

Figure 7:
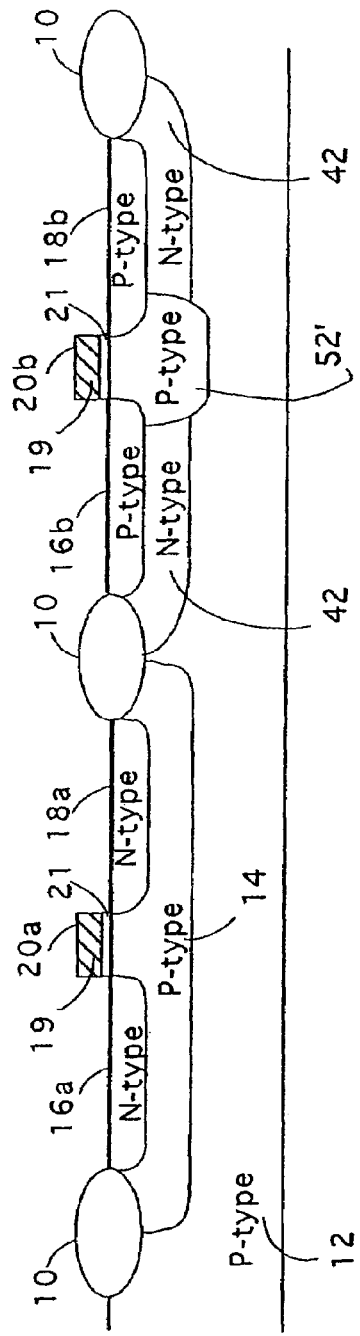
FIG. 7 is an exemplary simplified cross-sectional view of a CMOS device in which the p-type device has been modified in accordance with the present invention.

FIG. 7 depicts a cross-section of a CMOS device, where the PMOS device on the right has been modified in accordance with the present invention so that it is permanently ON. The concept and process is similar to the process involving the NMOS devices discussed above. In this embodiment, a p-well 52' is implanted in the substrate 12 under the gate 20b. It is possible that a dosage of boron ions used to create the p-well 52' is enough in the standard process to overcome the implanted n-well 42 at the surface of the substrate 12. Thus, the conduction path will be present from source and drain p-regions 16b, 18b through the channel 52' to the p-type substrate 12. Therefore, the semiconductor device will always be ON for a reasonable gate voltage, but also shorted to the substrate 12.

Figure 8:
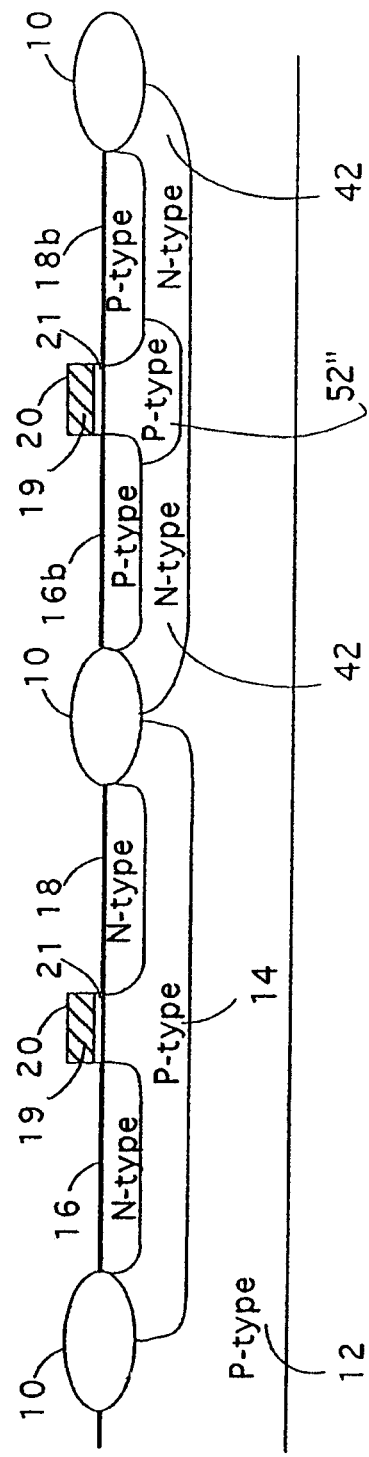
FIG. 8 is another exemplary simplified cross-sectional view of a CMOS device in which the p-type device has been modified in accordance with the present invention.

One skilled in the art will appreciate that in some applications it may be undesirable for the semiconductor device to be shorted to the substrate as shown in FIG. 7. FIG. 8 depicts a cross-sectional view of a CMOS device, where the PMOS device on the right has been modified in accordance with the present invention, where the PMOS device is not shorted to the substrate 12. The concept and process is similar to the process involving the PMOS transistor described above with reference to FIG. 7. However, a p-well 52" is implanted in the substrate 12 under the gate 20b. The dosage of boron ions used to create the p-well 52" is enough to overcome the n-type well 42 at the surface of the substrate between the active regions 16b, 18b. However, the depth of p-type well 52" is controlled to be slightly shallower than n-type well 42. Thus, n-type well 42 prevents p-type well 52" from shorting to the substrate 12. One skilled in the art will appreciate that the process may already have processing steps which result in the n-well 42 being deeper than the p-well 52" while p-well 52" overrides n-well 42 at the surface of the substrate. In this case, the processes would not require modification.

In FIG. 7, p-well 52' is deeper than and overrides n-well 42. Thus, any voltage applied to either p-type region 16b, 18b will pass to p-well 52' and short to p-type substrate 12. In FIG. 7, one skilled in the art will appreciate that n-well 42 is optional because it does not change the operation of the circuit. If the device shown in FIG. 6d is being manufactured with the same processes as the device of FIG. 7 or 8 and the manufacturer desires to place the p-type well 14 of FIG. 6d, or the n-type well 42 of FIG. 7 to further confuse the reverse engineer, then an extra processing step would be required to ensure p-well 52', 52" overrides n-well 42 at the surface of the substrate 12. In FIG. 6d, it is important for the operation of the false transistor that the n-well 22 override the p-well 14 at the surface of the substrate 12. However, in the FIGS. 7 and 8 it is important that the p-well 52', 52" override the n-well 42 at the surface of the substrate 12 in order to provide an electrical path between active regions 16b, 18b. Thus, in order to form both a PMOS and NMOS device in accordance with the present invention, two different p-well steps are required. Each p-well step will have a slightly different density of boron ions and/or different temperature cycles to ensure that in one step p-well 52' of FIG. 7 or p-well 52" of FIG. 8 overrides n-well 42, while in the other step p-well 14 of FIG. 6d does not override n-well 22. Of course, one skilled in the art will appreciate that instead of using two different p-well process steps; two different n-well process steps could be used to achieve the same result.

If a PMOS and a NMOS device are both to be manufactured using a standard double-well manufacturing process without adding additional process steps, then one skilled in the art will appreciate that n-well 42 is generally not placed to ensure p-well 52 will be placed under gate 20b. However, the structures shown in FIGS. 7 and 8 may be accomplished during double-well manufacturing processes. The manufacturing of the structures shown in FIGS. 7 and 8 may or may not require additional manufacturing steps depending upon the concentration profile of the n-wells and p-wells after implementation and temperature cycling.

It is very difficult for the reverse engineer to detect the techniques disclosed herein. For example, even when using microscopic investigates like SEM analysis on the top (plan view) side of the circuit of semiconductor devices altered by the techniques herein disclosed, the altered circuit will look identical to other standard semiconductor devices. Should the reverse engineer determine that further analysis of all millions of the semiconductor devices is required, then the metal, oxide, and insulation layers must be carefully removed. Next, the reverse engineer must perform a stain and etch to determine that the well implant has been placed where the gate had been. This will be difficult because for many dense ICs there will always be a well implant in the gate region under the gate, only the well implant is usually a different type than the active regions adjacent to the gate region. However, in the case of the present invention, the well will be the same type as the semiconductor active regions adjacent to the gate region. Therefore, the reverse engineer must be able to determine between the different types of well conductivity types. Using the present techniques, the gate well implants are low dose. Thus, the chemical etches dependent on the chemical nature of the implanted material will not be as effective. As a result, it is believed that the techniques which will be needed to detect the use of the present invention will be sufficiently time consuming to deter the reverse engineer. A complex integrated circuit may comprise millions of semiconductor devices, and if the reverse engineer must carefully analyze each semiconductor device in order to determine whether or not the present invention has been used to disguise each semiconductor device, the effort involved in reverse engineering such an integrated circuit will be tremendous.

Having described the invention in connection with certain embodiments thereof, modification will now certainly suggest itself to those skilled in the art, for example, other doses or other types of semiconductor devices. As such, the invention is not to be limited to the disclosed embodiments, except as is specifically required by the appended claims.

The invention claimed is:

1. A method of camouflaging a circuit comprising the steps of:
fabricating a device having a gate disposed on an insulating layer, the insulating layer being disposed on a substrate of a first conductivity type, said device having at least two active regions of a second conductivity type; and
inserting a first well in said substrate beneath said gate, said first well beneath said gate having a second conductivity type, said first well beneath said gate being in physical contact with said at least two active regions, said first well beneath said gate providing an electrical path between said at least two active regions regardless of any reasonable voltage applied to said gate.

2. The method of claim 1 wherein said step of inserting a first well beneath said gate includes the step of driving in said first well beneath said gate such that said well beneath said gate is deeper than said at least two active regions.

3. The method of claim 2, said method further comprising the step of inserting a second well having a first conductivity type beneath at least a portion of at least one of said at least two active regions, said second well being separated from said first well.

4. The method of claim 3 wherein said first well beneath said gate is deeper than said second well.

5. The method of claim 1, further comprising:
inserting a second well in said substrate, said second well having the second conductivity type; and
inserting third and fourth active regions in said second well, said third and fourth active regions having the first conductivity type and disposed in said second well and on opposite sides of a second gate;
wherein said first well and said second well have a same depth and a same doping.

6. The method of claim 5, wherein said first well and said second well are inserted in the same step.

7. The method of claim 5, wherein said first well has a lower surface comprising a substantially flat portion.

8. A method of forming a CMOS circuit comprising the steps of: modifying a conventional CMOS double well manufacturing process, wherein a conventional well of a first conductivity type is replaced with a well of a second conductivity type to thereby render a device formed at least in part by said well of a second conductivity permanently ON regardless of any reasonable voltages applied to said device.

9. The method of claim 8, wherein said CMOS device comprises a plurality of active regions, said well of a second conductivity type being deeper than said active regions.

10. The method of claim 8 further comprising the step of forming at least one additional well of a first conductivity type, said well of a second conductivity type being shallower than said at least one additional well.

11. The method of claim 8 wherein the device has a gate and wherein the device is permanently ON regardless of any reasonable voltages applied to said gate.

12. The method of claim 1 wherein said any reasonable voltage is a voltage which does not break down the insulating layer on which the gate is disposed.

13. The method of claim 1 wherein the insulating layer on which the gate is disposed is a gate oxide layer and wherein said any reasonable voltage is a voltage which does not break down the gate oxide layer.

* * * * *